US009287005B2

(12) United States Patent
Budhabhatti et al.

(10) Patent No.: US 9,287,005 B2
(45) Date of Patent: Mar. 15, 2016

(54) DETECTING MISSING WRITE TO CACHE/MEMORY OPERATIONS

(71) Applicant: International Business Machines Corporation, Armonk, NY (US)

(72) Inventors: Bhavesh D. Budhabhatti, Bangalore (IN); Manoj Dusanapudi, Bangalore (IN); Sairam Kamaraju, Bangalore (IN); Varun Mallikarjunan, Trumpington (GB); Subrat K. Panda, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 138 days.

(21) Appl. No.: 14/105,443

(22) Filed: Dec. 13, 2013

(65) Prior Publication Data

US 2015/0170764 A1  Jun. 18, 2015

(51) Int. Cl.
| | |
|---|---|
| G11C 29/10 | (2006.01) |
| G06F 12/08 | (2006.01) |
| G06F 13/16 | (2006.01) |
| G06F 13/38 | (2006.01) |
| G11C 29/26 | (2006.01) |

(Continued)

(52) U.S. Cl.
CPC .............. *G11C 29/10* (2013.01); *G06F 11/263* (2013.01); *G06F 12/0802* (2013.01); *G06F 13/1694* (2013.01); *G06F 13/385* (2013.01); *G11C 7/20* (2013.01); *G11C 29/26* (2013.01); *G06F 2212/2515* (2013.01); *G11C 2029/0409* (2013.01)

(58) Field of Classification Search
CPC ............ G06F 12/0802; G06F 13/1694; G06F 13/385; G06F 2212/2515; G11C 29/10; G11C 29/26; G11C 7/20

USPC ................ 714/718; 365/200, 201, 230.03; 711/E12.017, 118, 119; 710/10, 22, 26
See application file for complete search history.

(56) References Cited

U.S. PATENT DOCUMENTS

| | | | | |
|---|---|---|---|---|
| 4,945,548 | A | * | 7/1990 | Iannarone et al. ............ 375/214 |
| 5,682,457 | A | * | 10/1997 | Woo et al. ..................... 386/208 |

(Continued)

FOREIGN PATENT DOCUMENTS

WO    2007065104 A2    6/2007

OTHER PUBLICATIONS

Hu et al., "Avoiding Store Misses to Fully Modified Cache Blocks", Performance, Computing, and Communications Conference, 2006. IPCCC 2006. 25th IEEE International, Date of Conference: Apr. 10-12, 2006, pp. 289-296.

*Primary Examiner* — John J Tabone, Jr.
(74) *Attorney, Agent, or Firm* — Stephen Darrow

(57) ABSTRACT

Using an "optimized" test case for testing hardware and/or software of a computer. The optimized test case is designed to be run on a data storage device including multiple read locations and multiple write locations. Initialization data is written, on the data storage device, only to the write locations of the data storage device. The optimized test case is run on the data storage device in a manner so that the optimized test case will only write data to each write location after that write location has had initialization data written to that write location. The optimized test case defines read locations and write locations so that, during running of the optimized test case, all read locations which are also write locations will be written by a write instruction of the test case before being read by a read instruction of the test case.

18 Claims, 8 Drawing Sheets

(51) Int. Cl.
  *G11C 7/20* (2006.01)
  *G06F 11/263* (2006.01)
  *G11C 29/04* (2006.01)

(56) References Cited

U.S. PATENT DOCUMENTS

| | | |
|---|---|---|
| 6,192,452 B1 | 2/2001 | Bannister et al. |
| 6,334,174 B1 * | 12/2001 | Delp et al. ............... 711/167 |
| 6,470,409 B1 * | 10/2002 | Ridgeway ................. 710/305 |
| 6,732,234 B1 * | 5/2004 | Rowlands et al. ........... 711/117 |
| 6,748,492 B1 * | 6/2004 | Rowlands et al. ........... 711/128 |
| 6,957,301 B2 | 10/2005 | Deenadhayalan et al. |
| 7,356,744 B2 | 4/2008 | Korhonen |
| 7,405,976 B2 | 7/2008 | Hebishima |
| 7,539,909 B2 * | 5/2009 | LeClerg et al. ............. 714/718 |
| 7,647,539 B2 | 1/2010 | Bussa et al. |
| 7,669,083 B2 | 2/2010 | Arora et al. |
| 7,966,521 B2 | 6/2011 | Bussa et al. |
| 2005/0071580 A1 * | 3/2005 | LeClerg et al. ............. 711/154 |
| 2005/0204185 A1 | 9/2005 | Tait et al. |
| 2006/0136682 A1 * | 6/2006 | Haridas et al. ............. 711/154 |
| 2007/0067572 A1 | 3/2007 | Jiao et al. |
| 2009/0097149 A1 | 4/2009 | Justo |
| 2011/0170212 A1 | 7/2011 | Choi et al. |
| 2012/0221905 A1 | 8/2012 | Burger et al. |

* cited by examiner

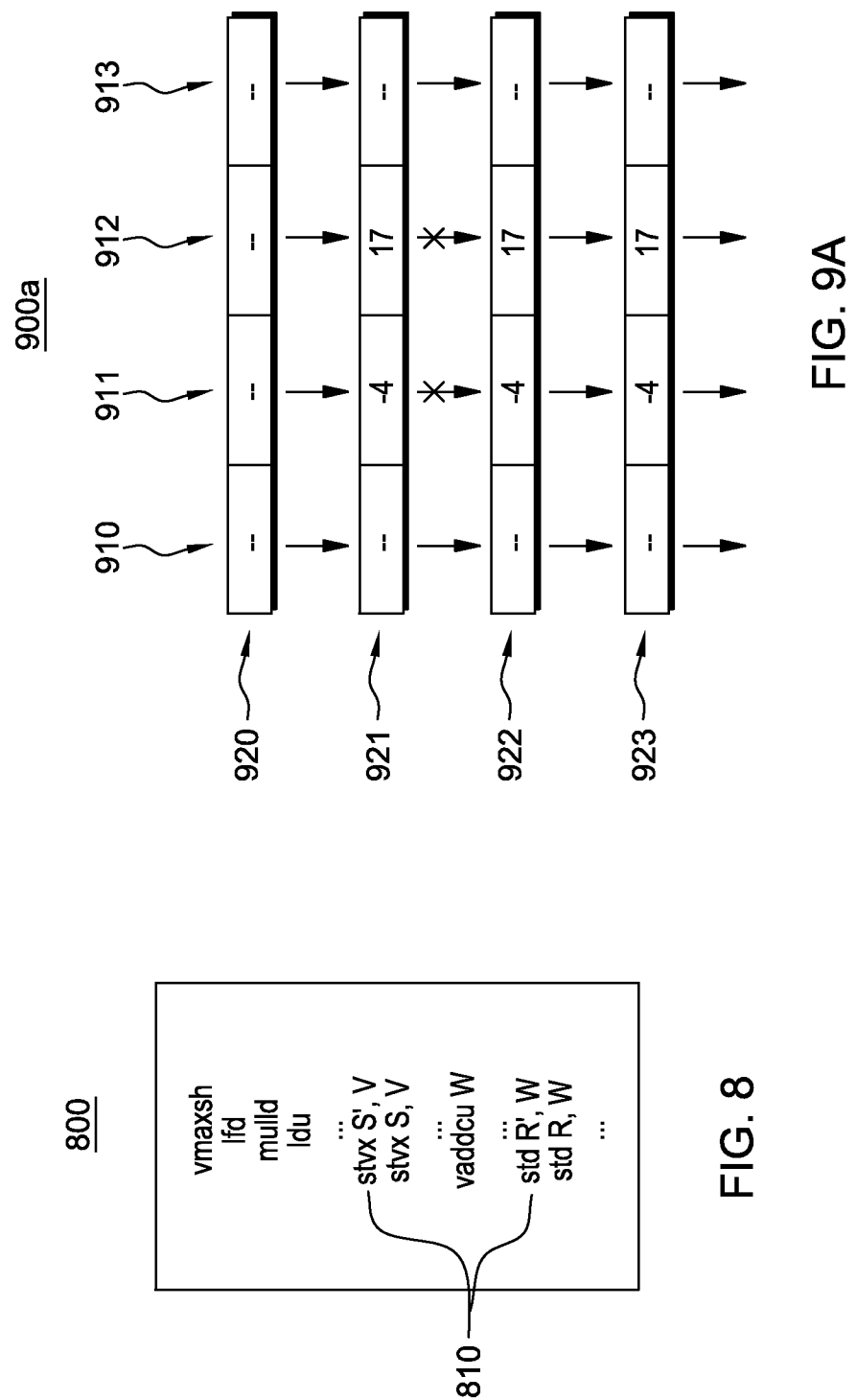

DETECTING MISSING WRITE TO CACHE/MEMORY OPERATIONS

FIELD OF THE INVENTION

The present invention relates generally to the field of computer systems validation, and more particularly to memory system verification for symmetric multiprocessing systems.

BACKGROUND OF THE INVENTION

Symmetric multiprocessing (SMP) involves a multiprocessor (or multi-core) computer architecture where multiple homogeneous processors (or cores) are connected to a centralized shared main memory. The processors have equal access to system resources and are controlled by a single operating system instance. They are treated equally in that none are reserved for special purposes. Apart from sharing resources, they are capable of operating independently and often have a dedicated cache memory to enhance performance. SMP systems allow any processor to work on any task, with the limitation that each task in the system is executing on no more than one processor at a time. With proper operating system support, SMP systems can easily move tasks between processors to efficiently balance system workload.

With frequency scale-up having reached its practical limit to drive increased computer processing speeds, computer systems are now growing instead in number of cores per chip and number of chips per system. Most of these systems are full symmetric multiprocessing (SMP) systems, which require relatively complex sub-systems for cache coherency maintenance and bus arbitration. At the same time, memory sub-systems are increasing the number of cache levels supported before write operations reach physical memory. All of these caches and memory must be kept coherent, thus adding an additional layer of complexity to an already complex system.

Large SMP systems and deeper cache hierarchies increase the possibility of certain write operations failing to occur when they should because of issues in coherency protocols, bus arbitration, or control logic. This is particularly true for applications which are memory intensive, because these applications stress the memory sub-system much more than others. Even missing a write of a single byte can cause an application to crash, and if the missing write operation is for privileged software, like a hypervisor working with logical partition environments, the system may halt completely.

SUMMARY

According to one aspect of the present disclosure, there is a computer program product, system and/or method which performs the following actions (not necessarily in the following order and not necessarily in serial sequence): (i) creating an optimized test case designed to be run on a data storage device including a plurality of storage locations, the optimized test case defining a plurality of write locations, and a plurality of read locations; (ii) writing initialization data, on the data storage device, only to the write locations of the data storage device; and (iii) running the optimized test case on the data storage device in a manner so that the optimized test case will only write data to each write location after that write location has had initialization data written to that write location. The optimized test case defines read locations and write locations so that, during running of the optimized test case, all read locations which are also write locations will be written by a write instruction of the test case before being read by a read instruction of the test case.

BRIEF DESCRIPTION OF THE SEVERAL VIEWS OF THE DRAWINGS

FIG. 8 is a diagram showing targeted initialization instructions inserted into a stream of computer code according to a third embodiment of the present invention;

FIG. 9A is a diagram showing a second iterative test execution process prior to application of an embodiment of the present invention.

DETAILED DESCRIPTION

Figure 1:
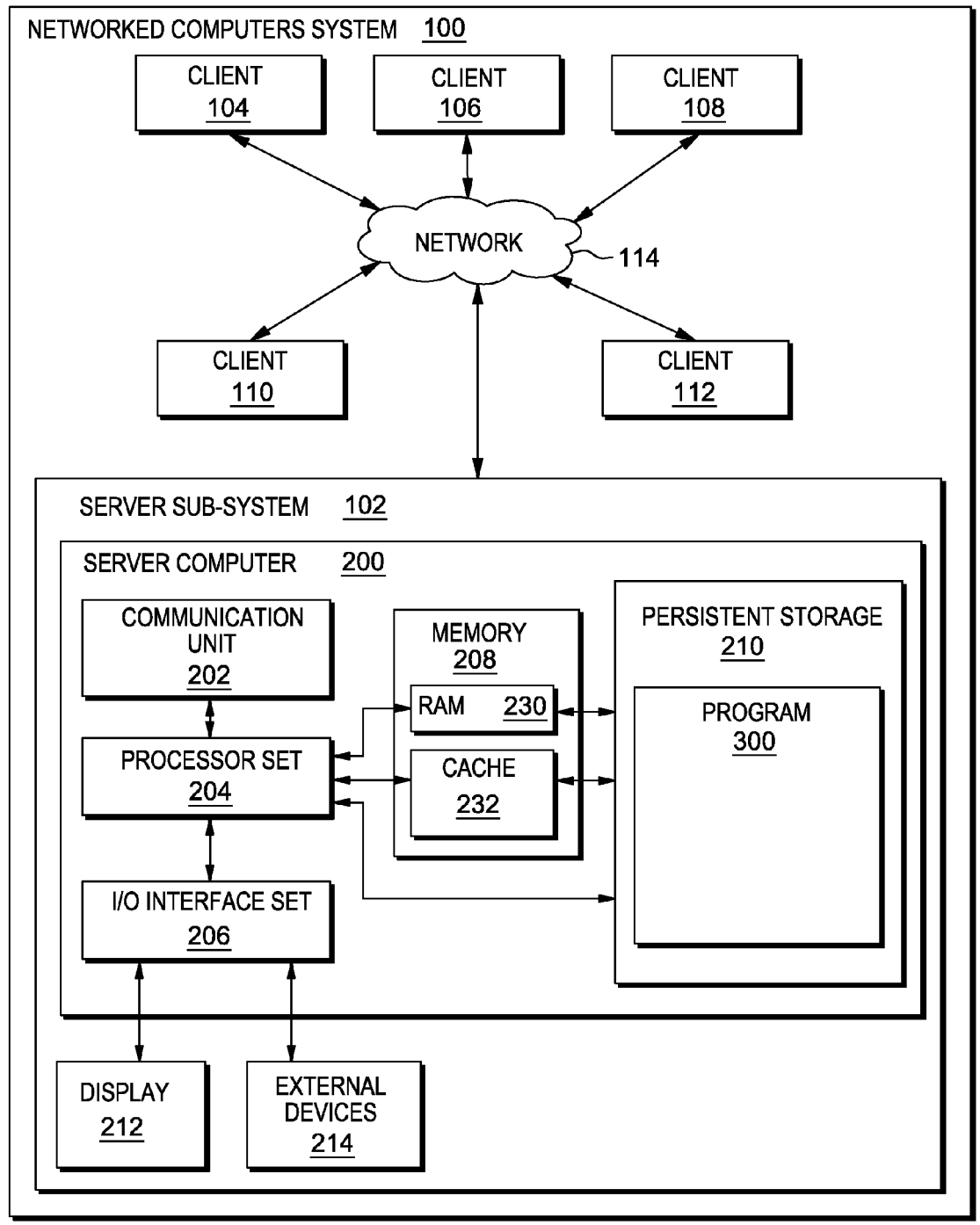
FIG. 1 is a schematic view of a first embodiment of a networked computers system according to the present invention.

Some embodiments of the present invention provide a way to avoid completely rewriting a memory area between successive runs of a test case used for validation while simultaneously maintaining low overhead.

This Detailed Description section is divided into the following sub-sections: (i) The Hardware and Software Environment; (ii) Relatively Simple Embodiment; (iii) Further Comments and/or Embodiments; and (iv) Definitions.

I. THE HARDWARE AND SOFTWARE ENVIRONMENT

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer-readable medium(s) having computer-readable program code/instructions embodied thereon.

Any combination of computer-readable media may be utilized. Computer-readable media may be a computer-readable signal medium or a computer-readable storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of a computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain, or store, a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device.

Program code embodied on a computer-readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object-oriented programming language such as Java (note: the term(s) "Java" may be subject to trademark rights in various jurisdictions throughout the world and are used here only in reference to the products or services properly denominated by the marks to the extent that such trademark rights may exist), Smalltalk, C++ or the like and conventional procedural programming languages, such as the "C" programming language or similar programming languages. The program code may execute entirely on a user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer, other programmable data processing apparatus, or other devices to function in a particular manner, such that the instructions stored in the computer-readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer-implemented process such that the instructions which execute on the computer or other programmable apparatus provide processes for implementing the functions/acts specified in the flowchart and/or block diagram block or blocks.

An embodiment of a possible hardware and software environment for software and/or methods according to the present invention will now be described in detail with reference to the Figures. FIG. 1 is a functional block diagram illustrating various portions of distributed data processing system (networked computers system) 100, including: server computer sub-system (that is, a portion of the larger computer system that itself includes a computer) 102; client computer sub-systems 104, 106, 108, 110, 112; communication network 114; server computer 200; communication unit 202; processor set 204; input/output (i/o) interface set 206; memory device 208; persistent storage device 210; display device 212; external device set 214; random access memory (RAM) devices 230; cache memory device 232; and program 300.

As shown in FIG. 1, server computer sub-system 102 is, in many respects, representative of the various computer sub-system(s) in the present invention. Accordingly, several portions of computer sub-system 102 will now be discussed in the following paragraphs.

Server computer sub-system 102 may be a laptop computer, tablet computer, netbook computer, personal computer (PC), a desktop computer, a personal digital assistant (PDA), a smart phone, or any programmable electronic device capable of communicating with the client sub-systems via network 114. Program 300 is a collection of machine-readable instructions and/or data that is used to create, manage and control certain software functions that will be discussed in detail, below, in the Relatively Simple Embodiment sub-section of this Detailed Description section.

Server computer sub-system 102 is capable of communicating with other computer sub-systems via network 114. Network 114 can be, for example, a local area network (LAN), a wide area network (WAN) such as the Internet, or a combination of the two, and can include wired, wireless, or fiber optic connections. In general, network 114 can be any combination of connections and protocols that will support communications between server and client sub-systems.

It should be appreciated that FIG. 1 provides only an illustration of one implementation (that is, system 100) and does not imply any limitations with regard to the environments in which different embodiments may be implemented. Many modifications to the depicted environment may be made, especially with respect to current and anticipated future advances in cloud computing, distributed computing, smaller computing devices, network communications and the like.

As shown in FIG. 1, server computer sub-system 102 is shown as a block diagram with many double arrows. These double arrows (no separate reference numerals) represent a communications fabric, which provides communications between various components of sub-system 102. This communications fabric can be implemented with any architecture designed for passing data and/or control information between processors (such as microprocessors, communications and network processors, etc.), system memory, peripheral devices, and any other hardware components within a system. For example, the communications fabric can be implemented, at least in part, with one or more buses.

Memory 208 and persistent storage 210 are computer-readable storage media. In general, memory 208 can include any suitable volatile or non-volatile computer-readable storage media. It is further noted that, now and/or in the near future: (i) external device(s) 214 may be able to supply, some or all, memory for sub-system 102; and/or (ii) devices external to sub-system 102 may be able to provide memory for sub-system 102.

Program 300 is stored in persistent storage 210 for access and/or execution by one or more of the respective computer processors 204, usually through one or more memories of memory 208. Persistent storage 210: (i) is at least more persistent than a signal in transit; (ii) stores the program on a tangible medium (such as magnetic or optical domains); and (iii) is substantially less persistent than permanent storage. Alternatively, data storage may be more persistent and/or permanent than the type of storage provided by persistent storage 210.

Program 300 may include both machine-readable and performable instructions and/or substantive data (that is, the type of data stored in a database). In this particular embodiment, persistent storage 210 includes a magnetic hard disk drive. To name some possible variations, persistent storage 210 may include a solid-state hard drive, a semiconductor storage device, a read-only memory (ROM), an erasable programmable read-only memory (EPROM), a flash memory, or any other computer-readable storage media that is capable of storing program instructions or digital information.

The media used by persistent storage 210 may also be removable. For example, a removable hard drive may be used for persistent storage 210. Other examples include optical and magnetic disks, thumb drives, and smart cards that are inserted into a drive for transfer onto another computer-readable storage medium that is also part of persistent storage 210.

Communications unit 202, in these examples, provides for communications with other data processing systems or devices external to sub-system 102, such as client sub-systems 104, 106, 108, 110, and 112. In these examples, communications unit 202 includes one or more network interface cards. Communications unit 202 may provide communications through the use of either or both physical and wireless communications links. Any software modules discussed herein may be downloaded to a persistent storage device (such as persistent storage device 210) through a communications unit (such as communications unit 202).

I/O interface set 206 allows for input and output of data with other devices that may be connected locally in data communication with server computer 200. For example, I/O interface set 206 provides a connection to external device set 214. External device set 214 will typically include devices such as a keyboard, a keypad, a touch screen, and/or some other suitable input device. External device set 214 can also include portable computer-readable storage media such as, for example, thumb drives, portable optical or magnetic disks, and memory cards. Software and data used to practice embodiments of the present invention, for example, program 300, can be stored on such portable computer-readable storage media. In these embodiments the relevant software may (or may not) be loaded, in whole or in part, onto persistent storage device 210 via I/O interface set 206.

I/O interface set 206 also connects in data communication with display device 212. Display device 212 provides a mechanism to display data to a user and may be, for example, a computer monitor or a smart phone display screen.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

II. RELATIVELY SIMPLE EMBODIMENT

Preliminary note: The flowchart and block diagrams in the following Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 2:
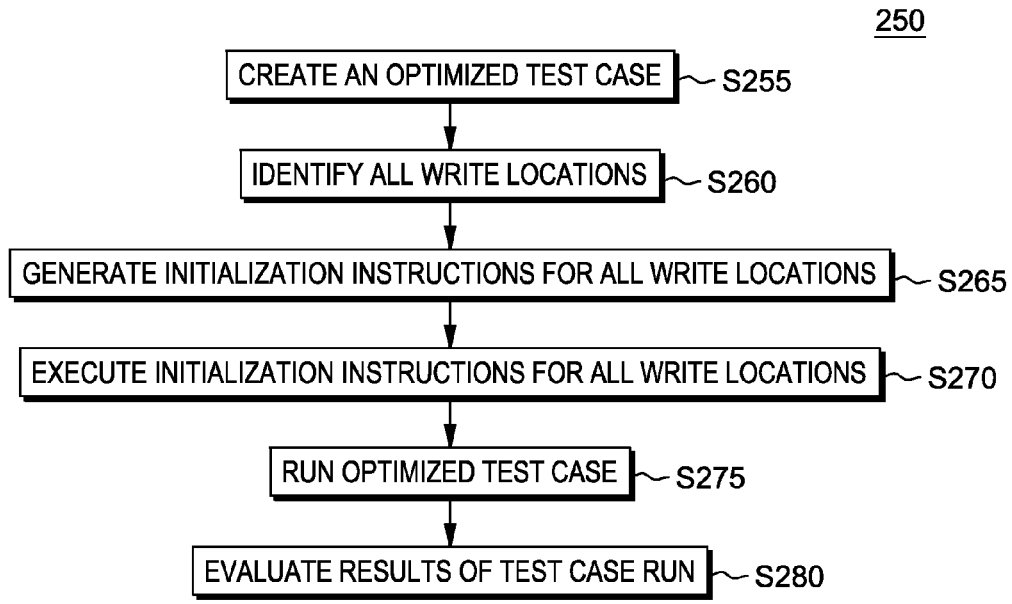
FIG. 2 is a flowchart showing a first process performed, at least in part, by the first embodiment computer system.
Figure 3:
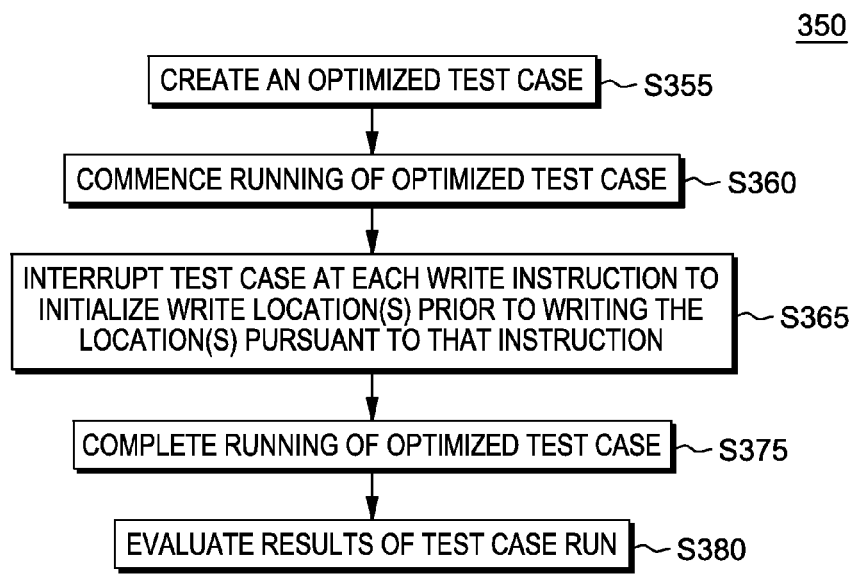
FIG. 3 is a flowchart showing a second process performed, at least in part, by the first embodiment computer system.
Figure 4:
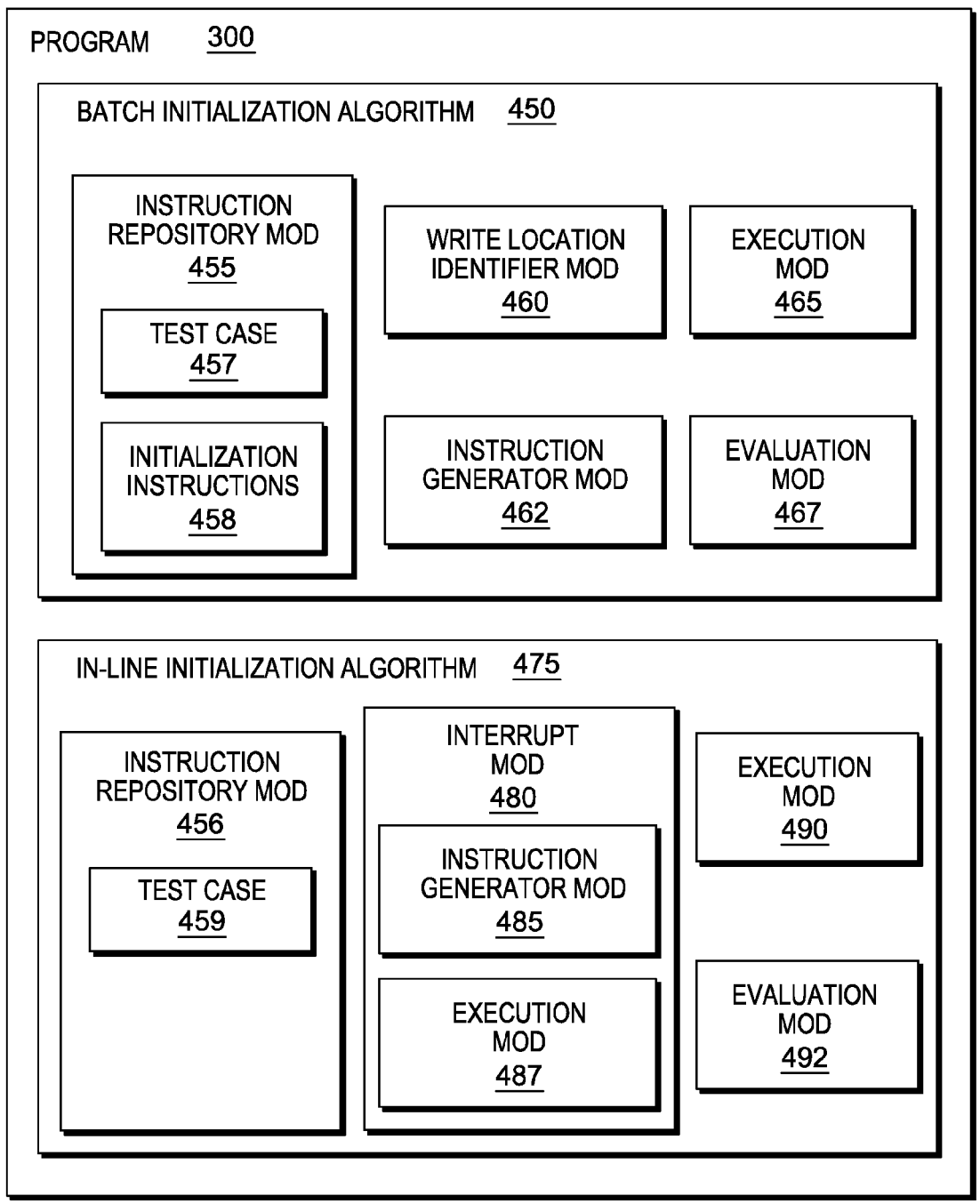
FIG. 4 is a schematic view of a portion of the first embodiment computer system.

FIG. 2 shows flowchart 250 depicting a first method according to the present invention. FIG. 3 shows flowchart 350 depicting a second method according to the present invention. FIG. 4 shows program 300 for performing at least some of the method steps of flowcharts 250 and 350. Although program 300 contains the software for performing both methods, the methods are normally to be used exclusive of one another. The method of flowchart 250 and associated software will now be discussed, over the course of the following paragraphs, with extensive reference to FIG. 2 (for the method step blocks) and FIG. 4 (for the software blocks).

Processing begins at step S255, where optimized test case 457 of machine instructions is created in instruction repository mod 455 of batch initialization algorithm 450. Test case 457 is created such that read (load) and write (store) locations are independent, except where write is followed by load. That is, in no instance does a load precede a write for a particular memory location. Using a set of instructions that adheres to this rule permits the detection of missed write operations even without reinitializing the whole memory area used by the test. Instead, a reduced set of locations can be initialized in an expedient fashion, because: (i) the instruction set can be executed multiple times in succession, but the read-only locations need only be initialized once; and (ii) no particular value need be used when initializing the write locations. These properties reduce the overhead required for initialization of cache/memory locations, as will be further discussed below. Alternatively, a non-optimized test case can be used. With this type of case, read-then-write locations may also need to be initialized for each successive run of the test case. The result of using this type of test case, relative to using the optimized version, is: (i) increased time spent for initialization; and/or (ii) greater overhead with respect to initialization metadata that must be maintained. In this first embodiment, test case 457 constitutes a test case used for validating proper operation of internal components, communications, and control logic in server computer system 200 (see FIG. 1).

Processing proceeds to step S260, where write location identifier mod 460 of batch initialization algorithm 450 identifies all write locations used in test case 457. As mentioned above, the special properties of test case 457 reduce the overhead required for initialization, particularly when executing the instruction set multiple times in succession. For instance, read-only address and value information is not needed for re-initialization, because only write locations need be reinitialized. Moreover, because write locations need not be initialized with any particular value, value information for initializing these locations need not be maintained. Because only write locations need to be reinitialized, reinitializations can take place much more quickly than if the whole memory area is reinitialized. Write location identifier mod 460 identifies these locations. In batch initialization algorithm 450, this identification is done offline by post-processing test case 457 after it is created. Alternatively, it could be done simultaneously with generation of the test case instructions. Alternatively, it could be done online as the test case is executed, for example as described in the Further Comments and/or Embodiments subsection of this Detailed Description in conjunction with FIGS. 6 and 7.

Processing proceeds to step S265, where instruction generator mod 462 of batch initialization algorithm 450 builds initialization instructions 458 that together initialize all write memory locations identified in the previous step with random values. Random values can be used because, as discussed in conjunction with step S255, test case 457 is designed so that write locations need not be initialized with any particular value. It is desirable that, for a given memory location, the initialization value be different than the value that should be written there by the test case, so that a failed write can be detected. While there is a small possibility these two values will match if, without more, a random value is used, in practice, the likelihood of the two values being identical is very small and can reasonably be ignored in most circumstances. Moreover, use of a random value prevents the need for bookkeeping overhead associated with identifying the value used in the test case and constructing a new value that is assuredly different from it. Alternatively, this information can be identified and used.

Processing proceeds to step S270, where instruction execution mod 465 of batch initialization algorithm 450 executes initialization instructions 458 to initialize all write locations with random values prior to each successive execution of test case 457 after the first. Alternatively, if an optimized test case is not used, initialization instructions 458 may also include instructions for initializing read-then-write locations.

Processing proceeds to step S275, where instruction execution mod 465 of batch initialization algorithm 450 executes test case 457. Write instructions of test case 457 are expected to overwrite the initialized values of the memory locations to which their output is directed.

Processing proceeds to step S280, where evaluation mod 467 of batch initialization algorithm 450 evaluates the results of the execution of test case 457 from the previous step. Since write locations were initialized by step S270, missed writes can be detected in this step by comparing the expected value at each write memory location with the actual value found there after the test case has been run.

Once step S265 creates initializing instructions 458, the sequence of steps S270, S275, and S280 can be repeated any number of times. In this embodiment, the foregoing set of steps S255 to S280 initialize memory locations with a small time and space overhead while still being able to detect situations where test case writes do not complete as expected.

The method of flowchart 350 and associated software will now be discussed, over the course of the following paragraphs, with extensive reference to FIG. 3 (for the method step blocks) and FIG. 4 (for the software blocks). This method is similar to the previous one except that initialization instructions are executed dynamically as the test case is run instead of being run ahead of time.

Processing begins at step S355, where optimized test case 459 of machine instructions is created in instruction repository mod 456 of in-line initialization algorithm 475. This is equivalent to step S255 for the batch initialization algorithm, and the same details and alternatives apply.

Processing proceeds to step S360, where execution mod 490 of in-line initialization algorithm 475 commences running of test case 459.

Processing proceeds to step S365, where interrupt mod 480 of in-line initialization algorithm 475 catches write attempts as test case 459 is run, passing control to instruction generator mod 485 to create an initialization instruction (or set of instructions) for the location(s) to which a write is being attempted. Execution mod 487 then executes the newly created instruction(s) to initialize the identified location(s). Alternatively, interrupt mod 480 is not needed, because the initialization instructions are instead generated prior to the current run of test case 459 and have been incorporated into it. This could be done, for example, by generating the initialization instructions offline by special processing of test case 459, or online via interrupts from a previous execution, and then inserting the initialization instruction(s) for a given write location just prior to the instruction in test case 459 to write to that location. As in step S265 of the previous algorithm, random values are used for initialization, with the same consequences and alternatives as previously discussed.

Processing proceeds to step S375, where execution mod 490 of in-line initialization algorithm 475 completes running of test case 459. In particular, mod 490 executes the write instruction on which the interrupt occurred, and this instruction is expected to overwrite the initialized value written there in the previous step.

Processing proceeds to step S380, where evaluation mod 492 of in-line initialization algorithm 475 evaluates the results of the execution of test case 459 from the previous three steps. Since write locations were initialized in step S365, missed writes can be detected in this step by comparing the expected value at each write memory location with the actual value found there after the test case has been run. Once step S355 is complete, the sequence of steps S360 to S380 can be repeated any number of times.

III. FURTHER COMMENTS AND/OR EMBODIMENTS

Some embodiments of the present disclosure recognize that typical steps in the validation or testing of processors are: (i) build or generate a test case; (ii) initialize the context of the test case; (iii) execute the test case; and (iv) check the test case results. Except for step (iii), all of these steps of this conventional processor validation method are herein referred to as "overhead." Step (iii) is therefore known as "deliberate testing" time. In processor validation, every second is expensive, which means that "overhead" is expensive. The present invention further recognizes that as overhead time decreases relative to deliberate testing time, more cost value is brought to the validation process.

Some embodiments of the present disclosure recognize that in validation of processors/systems, the same test case will often be reused multiple times, because each time it is run, the timing can be different. Two ways of executing the same test case multiple times, checking the results every time, are: (i) every time the test case executes, use a different footprint (memory) so that the results of each run can be captured in a new place and compared—but this requires a lot of memory and that will be a bottleneck; or (ii) re-execute on the same footprint—but with this approach, results from a previous execution will be overwritten, so missed writes on subsequent executions will not be detected. For example, if an instruction is "write to 0x1000" and this is executed two times, if the first time the write happens correctly but the second time it does not, the correct value will still be found at 0x1000 at the end of the second execution.

Some embodiments of the present disclosure recognize that to solve the problem with this second approach, the data must be re-initialized to zero and/or to some initial pattern between the two executions so that if the second execution does not write correctly, the initialized value will be seen rather than the value left over as a sort of residue from the first execution. To do this re-initialization before every re-execution, the complete memory can be initialized to a known value and then initial patterns can be written wherever there is a need to read known patterns. This approach has two problems: (i) the large amount of time required to initialize the whole memory; and (ii) the need to know where a known pattern is required, which necessitates saving those locations somewhere. An alternative approach is to initialize only those locations where writes or stores should occur. This is much faster than the previous method, but again the problem is how to know what locations are write locations. This information must be kept somewhere to look up so that only those areas can be initialized. The process of keeping information, like information for data initialization, for later look up is what is known as "bookkeeping."

Some embodiments of the present disclosure recognize that to prevent missing write/store operations, and their consequences, in the field demands more precise and targeted test cases from validation exercisers, and, in particular, coverage for where a write/store fails in some re-execution of a particular test case that had previously been executed one or more times without issue. Initialization of all memory locations between multiple re-executions of a test case decreases throughput and can also increase the space complexity of the test due to the need to keep certain information for later look up (see above). Yet, without the initialization of memory locations between re-executions, there is high probability that a missed write will go undetected, because data written into the memory from a previous execution make it seem as though the current execution wrote the data there, as the current execution was supposed to, but did not.

Figure 5:
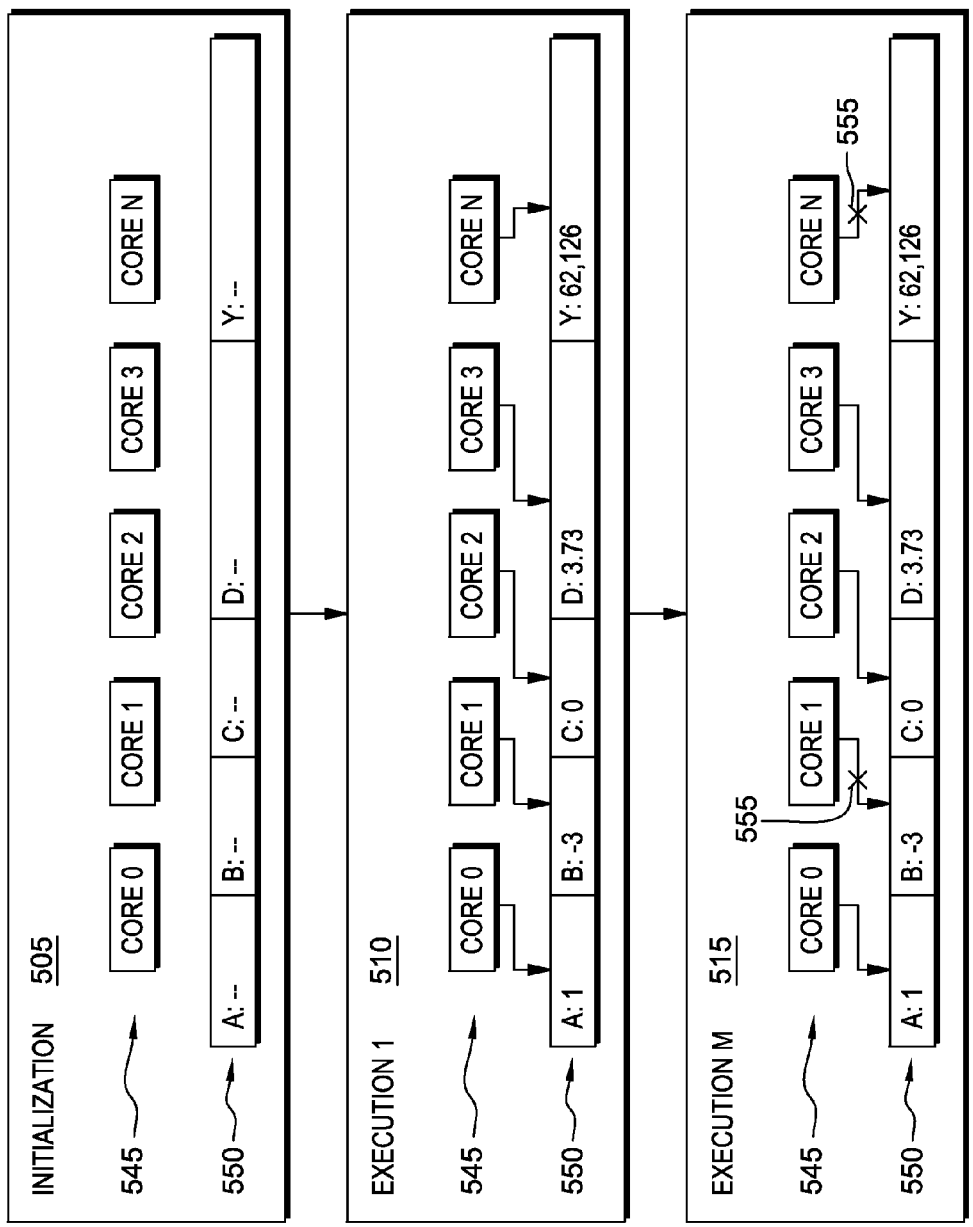
FIG. 5 is a diagram showing a first iterative test execution process.

This situation is illustrated in FIG. 5, which contains diagram 500 showing: a sequence of test case steps for a test case, including initialization 505, first execution 510, and m-th execution 515; a set of processor cores 545; a set of memory locations 550; and missed writes 555. During initialization 505, memory locations 550 are initialized with a value other than the one that will be written there in the test case. During first execution 510 of the test case, processor cores 545 each write certain values to respective memory locations 550, as shown. This execution proceeds well, and the test case passes. During m-th execution 515 of the test case, however, some of cores 545 experience missed writes 555, but because memory locations 550 were not re-initialized between first execution 510 and m-th execution 515, the storage locations nevertheless contain the values expected. As mentioned above, this is only due to the previous writing of memory from a previous execution, with the consequences that examination of these locations does not detect the missed writes and the test case therefore erroneously passes.

Some embodiments of the present disclosure solve the problem of undetected missed writes, to cache or memory, by precisely detecting these misses without compromising on deliberate testing (that is, time spent in the actual test case) and with minimal space complexity. Each execution memory location where a write is supposed to happen is initialized with part of a random pattern and without consuming too much space for bookkeeping. A test case is created where read (load) and write (store) locations are independent except in cases where write is followed by load. Thus, a given location that is written is never read (that is, loaded) prior to execution of the write (that is, store) instruction for that location. This rule for test cases regarding no reading a to-be-written location prior to writing by the test case prevents the random pattern of the initialization (which random pattern will be written to the to-be-written location) from causing unexpected results prior to the time the test case overwrites the random pattern at that location.

Some embodiments of the present disclosure recognize that initializing a write/store location requires two attributes related to the location: (i) the address of the location; and (ii) the length of the write/store operation, which in this case could be a byte or a collection of contiguous bytes.

Some embodiments of the present disclosure generate interrupts on each write (store) operation in a test case in an online or dynamic fashion. This is possible by virtue of the protection schema for stores. Inside the associated interrupt service routine (ISR), the faulting data address is noted and special instructions are built to execute writes of random values to this address. The instructions are built in a special space dedicated for initialization of memory. Execution of the test case continues each time the ISR returns. When the test case completes, a new set of instructions will have been generated which initialize only store locations. More generally, the operands of the new instructions need only be different from the original operands. However, in order to ensure they are different, the original values need be known. Because this may require maintaining additional information tracking, or bookkeeping, the easier way is to make the new operands random. This requires less overhead and will normally be quite acceptable because it is very rare that a random value will match the original operand.

In some such embodiments, translations are set such that a store protection fault is raised whenever the processor tries to execute a store instruction. The store protection fault transfers execution to an ISR. There is a special purpose register (SPR) in the architecture which stores the address for which the exception/fault has occurred. This identifies the needed address, the first attribute required for write location modification. There is also an SPR which stores the address of the instruction which caused the fault. The length of the memory operand on which an instruction operates is uniquely identified from the binary encoding of the instruction, which includes an opcode, operand encodings, and an optional extended opcode. Using the opcode and extended opcode (when present), the length of the operand used by the instruction can be easily and uniquely decoded. This identifies the length of the write/store operation, the second attribute required for write location modification.

The fault address and length of the operation can then be used to build a sequence of arithmetic instructions to point to the write fault address. After building the instructions to populate an address pointing register with that address, an instruction for initializing the indicated location with a random value is chosen. In order to minimize the penalty in terms of time, the same instruction which has caused the interrupt is used with the address pointing register constructed previously, but with a different source operand than that of the original instruction. The value in this source operand is chosen so as to be very random. The operand differs according to the class of memory write instructions for which the target memory location is initialized. For example, a floating point store instruction will use a floating point register as an operand, while an integer store instruction will use a general purpose register as a source operand.

Figure 6:
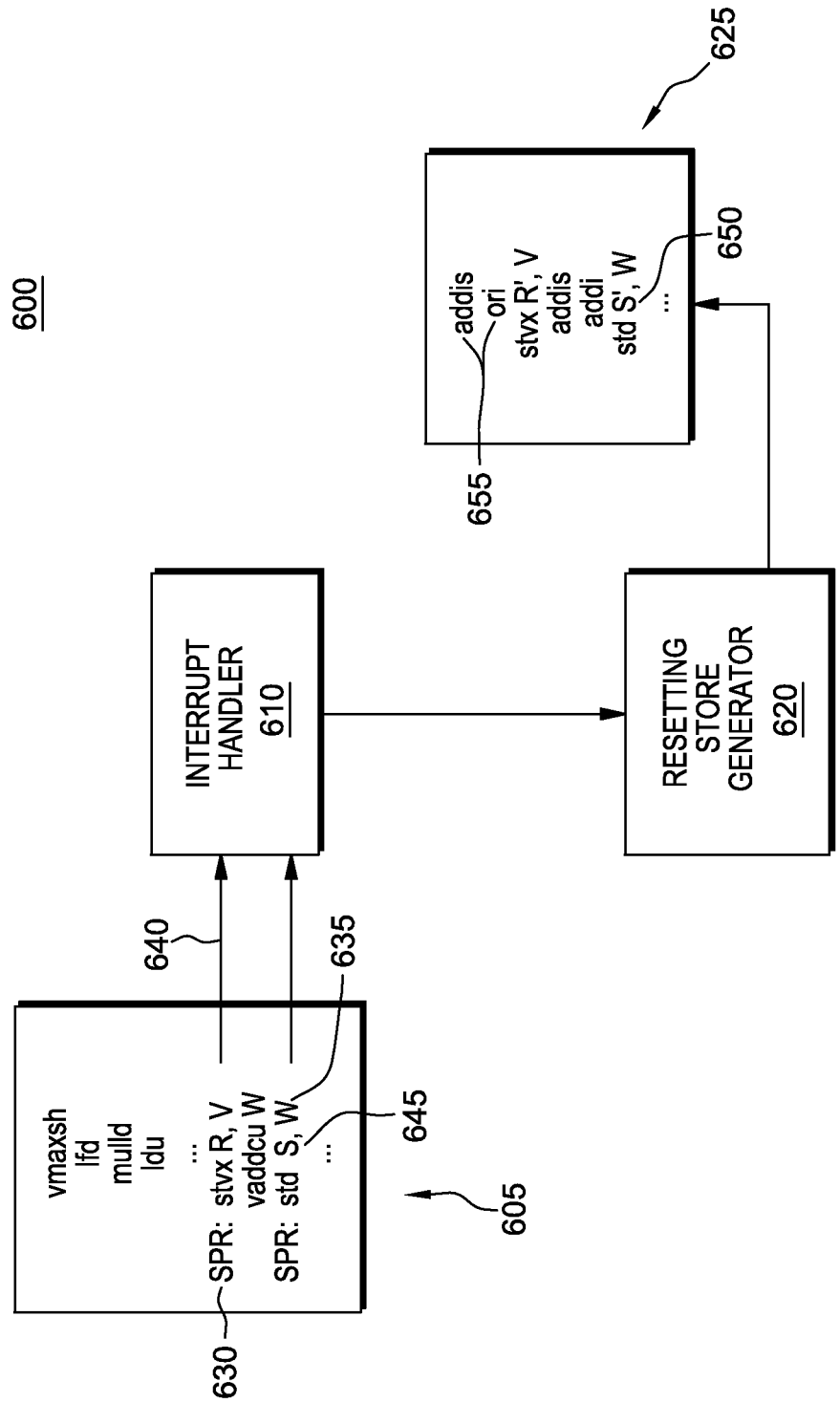
FIG. 6 is a diagram showing a first process for generating targeted initialization instructions according to a second embodiment of the present invention.

Shown in FIG. 6 is diagram 600, which illustrates this procedure. Diagram 600 includes: test case 605; interrupt handler 610; resetting store generator 620; store reset area (storage initializer area) 625; faulting instruction address register (special purpose register, or SPR) 630; faulting write data address 635; protection fault 640; source operand 645; source operand 650; and effective address generation instructions 655. Test case 605 is run in a configuration such that store protection faults are generated on write/store instructions. When such an instruction is encountered, protection fault 640 is triggered and control is passed to interrupt handler 610. From here, resetting store generator 620 extracts write address 635 from a data SPR (not shown), as well as the faulting instruction address from SPR 630. Then, using instructions such as "addis," "ori," and so on, it builds a new store instruction using both the opcode from the original instruction and write address 635, but replacing original source operand 645 with new, random source operand 650. This process is repeated for each store instruction encountered in the test case, until storage initializer area 625 contains a complete set of instructions for initializing all locations to which test case 605 writes. This set of instructions can then be run prior to each subsequent execution of the test case.

Figure 7:
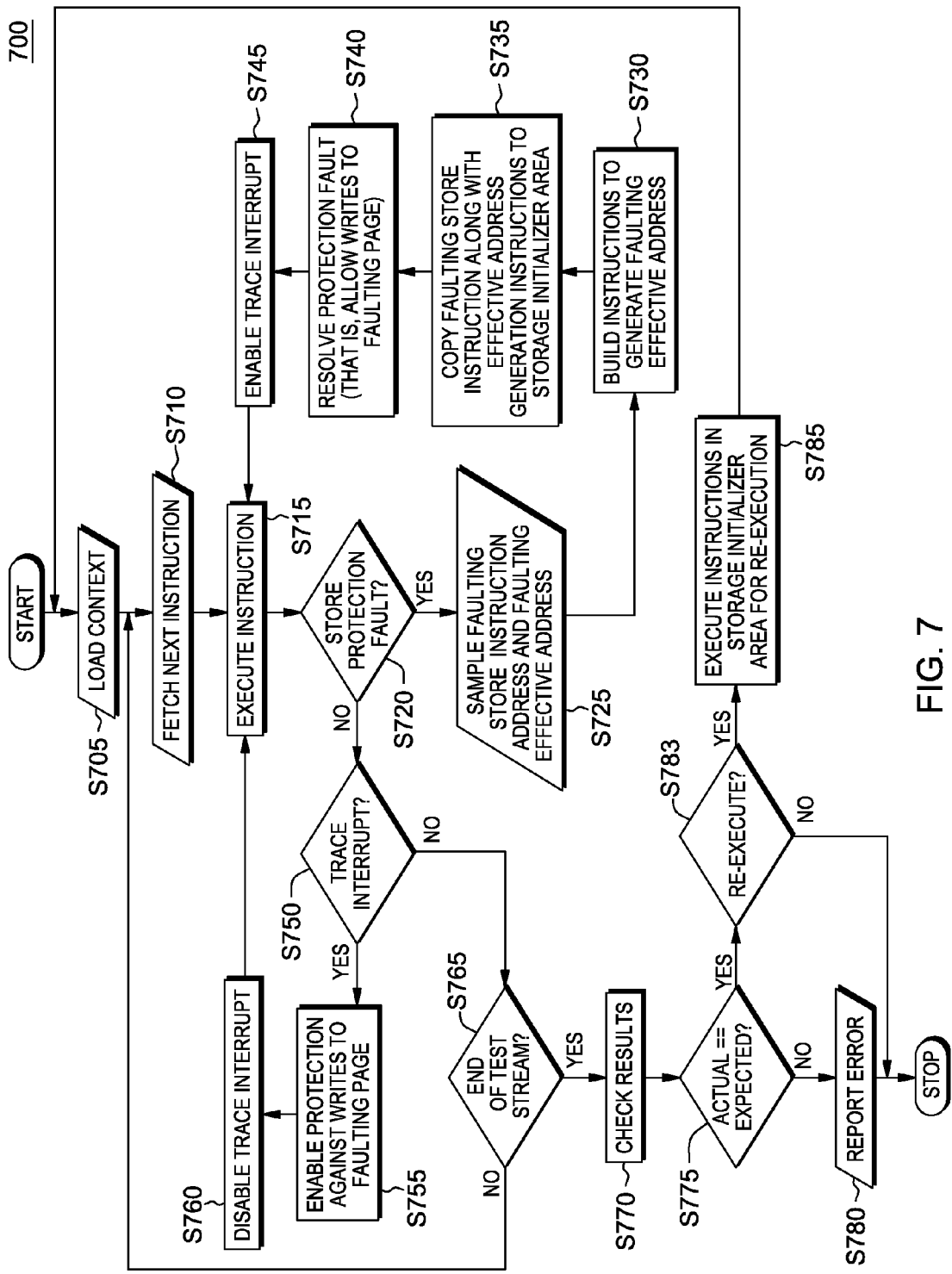
FIG. 7 is a flowchart detailing a first process for generating targeted initialization instructions according to a second embodiment of the present invention.

Shown in FIG. 7 is flowchart 700 detailing this process. The process begins at step S705, where the test case context is loaded and storage protection faults are enabled (to cause interrupts on future stores/writes). The process proceeds to step S710 and S715, where the next instruction is fetched and executed, respectively. If, in step S720, the instruction is a store instruction, steps S725, S730, S735, S740, and S745 are followed to sample the effective address and faulting address from the faulting instruction (S725), use this information to build resetting store instructions in the store initializer area by copying this store instruction and supplementing it with additional instructions to initialize the source register in that store instruction to a different source operand (S730 and S735), remove (correct or set so that write operations (stores) can be executed normally without an interrupt) the storage protection fault (S740), and enable trace interrupts (S745) in order to cause a trace interrupt after the instruction re-executes. Re-execution will lead to steps S755 and S760 via a trace interrupt in step S750, where storage protection faults are again enabled (to cause interrupts on future stores) and trace interrupts are disabled before proceeding to the next instruction. When a trace interrupt is not encountered in step S750 (because the executed instruction is not a store instruction), the next instruction is fetched and the process outlined above repeats from step S710 until the end of the test stream is reached (S765). At this point, results are checked (S770) and, if any errors encountered (S775), they are reported (S780) and the process stops. Alternatively, if no errors are encountered (that is, if actual results match expected results) and the test is to be re-executed (S783), the instructions in the storage initializer area created as a result of the above process are executed (S785), after which processing returns to step S705 for another iteration of the test case (with storage protection faults corrected or set so that write operations (stores) can be executed normally without an interrupt). In this way, the same test case—with a fixed number of instructions—can be reused multiple times.

Such online or dynamic embodiments may have one or more of the following features, characteristics, and/or advantages: (i) interrupt handling paths are stressed, which contributes to deliberate testing; (ii) an ISR generates a new set of instructions to be executed later, thus producing validated self-modifying code; (iii) no bookkeeping is needed to track all store locations inside a test case; (iv) every subsequent execution of a test case starts at the newly generated set of instructions which initialize store locations; (v) the only additional space required is for these new initialization instructions, which is considerably less compared to the space that would otherwise be required for bookkeeping; and/or (vi) the same instruction space can be used across multiple test cases executed one after the other.

Some embodiments of the present disclosure replicate, in a static or offline fashion, every store inside the test case, but with a different source operand so that the values stored can be different. These replicated stores are always executed before their original counterparts, no matter how many instructions earlier.

Such static or offline embodiments may have one or more of the following features, characteristics, and/or advantages: (i) initialization instructions are generated offline, thus incurring no additional on-platform cost; (ii) interrupts are minimal or non-existent, which is useful in test cases where interrupts are not desired; and/or (iii) since two stores go to same location and thus the same cache line, different timing can be created for stores depending on the distance (age) between the two stores.

In some such embodiments, the write-memory initialization code is built offline during the instruction stream generation process. In other such embodiments, it is built through some additional bookkeeping by post-processing the instruction streams and inserting those random-value initializing stores into the instruction stream as a part of the process.

Shown in FIG. 8 is diagram 800, showing instructions 810 which have been inserted into the regular instruction stream prior to the respective instructions from which they are derived.

One advantage of the offline approach in comparison to the online approach is that the address-building instructions do not have to be generated. This can also lead to faster deliberate testing time on the platform as the additional address-building instructions, though they may be arithmetic, do not have to be executed. The space penalty is also considerably lower than in the previous approach. However, care must be taken when inserting the additional random-value initializing stores. The instruction which is used to inject the random value into a write location has to be such that it does not change the instruction stream state. In other words, apart from randomly initializing the memory location which is eventually being overwritten by the following store, it should not disturb the register state/memory of the original environment. This typically is the case when handling store instructions which also update the register operands used to specify the address. In these cases, the appropriate memory-write/store instruction(s), which should match with the length of the location pointed to by the original instruction, need to be selected. Another non-intrusive approach is to take a backup of the original address-pointing register(s) into some scratch register(s) before the random-value initializing stores, then restore them after executing the original store instruction.

During test generation under the offline approach, a prerequisite instruction or instructions need to be built for store instructions. These pre-requisite instructions need to initialize the store location with some value not matching the original store. Until the original store is built, however, it is not known which locations must be initialized with random generation tools. Therefore, the original instructions are built first and then the instructions that precede the original stores to initialize the store locations are built afterwards. Since these later-built instructions precede their original instruction counterparts, they are called "pre-requisite" instructions.

Figure 9B:
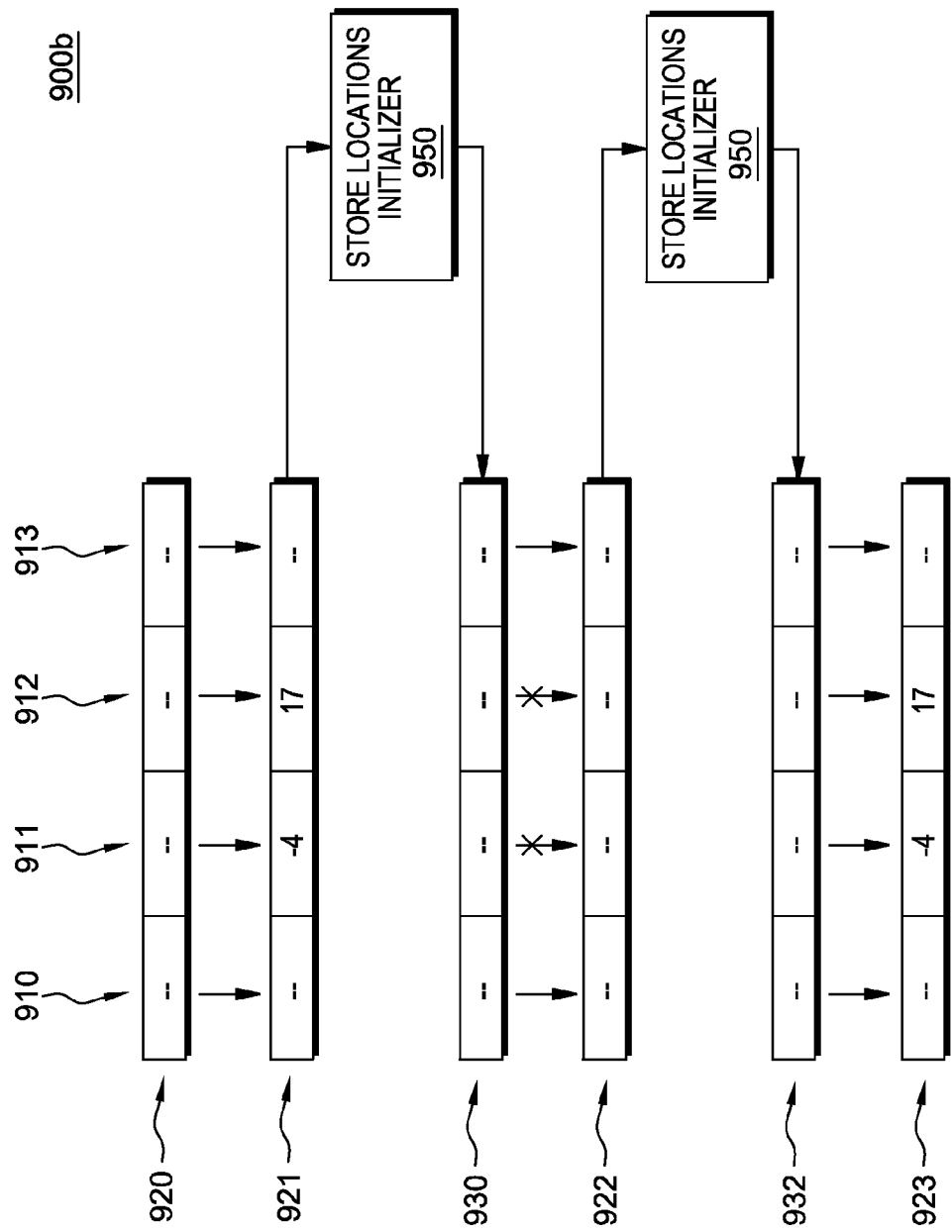
FIG. 9B is a diagram showing a second iterative test execution process subsequent to application of an embodiment of the present invention.

FIGS. 9A and 9B illustrate false positive testing results in a re-execution environment and how an embodiment of the present disclosure avoids such false positives, respectively. Shown in FIG. 9A is diagram 900a, which includes: memory locations 910, 911, 912, and 913; initial state 920; state after first execution 921; state after second execution 922; and state after execution 'n' 923. The contents of memory locations 910, 911, 912, and 913 are shown as '-' to indicate an initialized value, though not necessarily the same value, in each location. After the test is first executed, the resulting state after first execution 921 shows memory locations 911 and 912 holding the results of successful test write instructions to those locations. The test is then executed again, with unsuccessful test write instructions to locations 911 and 912, but because the correct results are still present from the first execution, the test erroneously passes with the results in state after second execution 922. Testing continues with subsequent re-executions until state after execution 'n' 923 is reached.

Shown in FIG. 9B is diagram 900b, which includes the same memory locations and states as diagram 900a, but also includes: state before second execution 930; state before third execution 932; and store locations initializer 950. After state after first execution 921, store locations initializer 950 is invoked, which re-initializes store locations 911 and 912 (though not necessarily with their previous initial values) to produce state before second execution 930. Because memory locations 911 and 912 have been reinitialized prior to the second execution, the unsuccessful writes to them during the second execution are properly detected in state after second execution 922. Store locations initializer 950 is again invoked to produce state before third execution 932, and the process continues in like fashion until arriving at state after execution 'n' 923. Because this embodiment uses random patterns for initialization, there is a small theoretical possibility that the random value placed in a particular memory location will match the value that is expected to be written there by the write instruction in the test case. In this situation, a missed write will not be detected. However, in a scenario where a random number generator for a 64-bit value is being used, for example, this will happen very rarely. Alternatively, an assuredly different value could be used, but this could come at the expense of more overhead to determine and keep track of the value to be avoided.

Some embodiments of the present disclosure perform one or more of the following functions: (i) detect holes in the hardware design; (ii) identify and capture hardware anomalies in updating memory accesses; (iii) track completed writes to memory and identify any data loss because of the long path from core to memory write through different buffers and caches; (iv) use a software algorithm to identify data loss because of some unexpected reason or because of hardware logic problems; (v) target a software mechanism to detect any data loss; (vi) use an algorithm to efficiently cover all data paths and identify data loss because of any memory write missing; (vii) use a simple and efficient algorithm to detect any write loss to memory without having to keep a lot of metadata about the stores themselves; (viii) identify lost and/or missing writes to memory or cache; (ix) detect a write failure in a system for any reason; (x) identify if there is any write operation lost on the fabric or system; (xi) use a validation methodology without having extra flags in hardware; and/or (xii) provide a validation algorithm for lost and/or missing memory writes.

Some embodiments of the present disclosure can be used: (i) when testing big memory areas; and/or (ii) in cases where a lot of bookkeeping cannot be tolerated, such as in bring-up environments and manufacturing environments. "Bring-up" is one of the stages in a processor lifecycle. In processor lifecycles, there are multiple stages. A processor moves from concept stage to design stage, where hardware designers write code in VHDL and do some unit level verification. Once there is confidence in the hardware code, the design is sent for initial manufacturing of the processor on silicon, and from there a few processors are brought into the lab for validation. Here a lot of software is run to determine if every function of the processor is working as designed or not. There may also be attempts to boot some operating system and see if previous generation software still works fine. This stage is called "bring-up" because the actual processor is being "brought up" on silicon.

IV. DEFINITIONS

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein that are believed as maybe being new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

and/or: inclusive or; for example, A, B "and/or" C means that at least one of A or B or C is true and applicable.

Software storage device: any device (or set of devices) capable of storing computer code in a manner less transient than a signal in transit.

Tangible-medium software storage device: any software storage device (see Definition, above) that stores the computer code in and/or on a tangible medium.

Non-transitory software storage device: any software storage device (see Definition, above) that stores the computer code in a non-transitory manner.

Computer: any device with significant data processing and/or machine-readable instruction reading capabilities including, but not limited to: desktop computers, mainframe computers, laptop computers, field-programmable gate array (fpga) based devices, smart phones, personal digital assistants (PDAs), body-mounted or inserted computers, embedded device style computers, application-specific integrated circuit (ASIC) based devices.

Cache/memory: any data storage device; cache and memory are used interchangeably herein.

Initialization data: may include, but need not be limited to, pseudo-random values, constant values, pre-specified patterns, and values selected to avoid some particular value.

What is claimed is:

1. A method comprising:
creating an optimized test case, comprising a set of test case instructions, for testing a system utilizing a data storage device including a plurality of storage locations, the optimized test case defining:
   a plurality of write locations on the data storage device, and
   a plurality of read locations on the data storage device;
executing a set of initialization instructions that initialize the plurality of write locations without initializing the plurality of read locations; and
running the optimized test case so that the set of test case instructions first writes to each write location of the plurality of write locations after the set of initialization instructions initializes that write location;
wherein:
the optimized test case defines the plurality of read locations as those locations on the data storage device to be read from but not written to by the set of test case instructions during execution of the optimized test case; and
the optimized test case defines the plurality of write locations as: (i) those locations on the data storage device to be written to but not read from by the set of test case instructions during execution of the optimized test case, and (ii) those locations on the data storage device to be read from by the set of test case instructions during execution of the optimized test case only after being written to by the set of test case instructions during execution of the optimized test case.

2. The method of claim 1 wherein the running of the optimized test case is a second run of the optimized test case, the method further comprising:
initially running the optimized test case;
wherein:
the initial run and the second run are performed at different timings; and
the initial run is completed before the execution of the set of initialization instructions.

3. The method of claim 1 wherein the running of the optimized test case is a second run of the optimized test case, the method further comprising:
generating the set of initialization instructions by:
   interrupting an initial run of the optimized test case at one or more write instructions of the set of test case instructions writing to one or more write locations in the plurality of write locations, and
   extracting information about the one or more write instructions sufficient to generate one or more initialization instructions to initialize the one or more write locations.

4. The method of claim 1 further comprising:
generating the set of initialization instructions;
wherein:
the set of initialization instructions is generated without running the optimized test case.

5. The method of claim 1 wherein:
the execution of the set of initialization instructions is completely performed for all write locations in the plurality of write locations before running of the optimized test case begins.

6. The method of claim 1 wherein:
each write location in the plurality of write locations is initialized by interrupting the running of the optimized test case and initializing that write location immediately prior to executing a test case instruction in the set of test case instructions that writes to that write location.

7. A computer program product comprising software stored on a non-transitory software storage device, the software comprising:
first program instructions programmed to create an optimized test case, comprising a set of test case instructions, for testing a system utilizing a data storage device including a plurality of storage locations, the optimized test case defining a plurality of write locations on the data storage device and a plurality of read locations on the data storage device;
second program instructions programmed to execute a set of initialization instructions that initialize the plurality of write locations without initializing the plurality of read locations; and
third program instructions programmed to run the optimized test case so that the set of test case instructions first writes to each write location of the plurality of write locations after the set of initialization instructions initializes that write location;
wherein:
the optimized test case defines the plurality of read locations as those locations on the data storage device to be read from but not written to by the set of test case instructions during execution of the optimized test case; and
the optimized test case defines the plurality of write locations as: (i) those locations on the data storage device to be written to but not read from by the set of test case instructions during execution of the optimized test case, and (ii) those locations on the data storage device to be read from by the set of test case instructions during execution of the optimized test case only after being written to by the set of test case instructions during execution of the optimized test case.

8. The product of claim 7 wherein the running of the optimized test case is a second run of the optimized test case, the product further comprising:
fourth program instructions programmed to initially run the optimized test case;
wherein:
the initial run and the second run are performed at different timings; and
the initial run is completed before the execution of the set of initialization instructions.

9. The product of claim 7 wherein the running of the optimized test case is a second run of the optimized test case, the product further comprising fourth program instructions programmed to generate the set of initialization instructions by:
interrupting an initial run of the optimized test case at one or more write instructions of the set of test case instructions writing to one or more write locations in the plurality of write locations; and
extracting information about the one or more write instructions sufficient to generate one or more initialization instructions to initialize the one or more write locations.

10. The product of claim 7 further comprising:
fourth program instructions are programmed to generate the set of initialization instructions without running the optimized test case.

11. The product of claim 7 wherein:
the second program instructions are programmed to completely execute the set of initialization instructions before the third program instructions begin running the optimized test case.

12. The product of claim 7 wherein:

the second program instructions are further programmed to execute the set of initialization instructions so that each write location in the plurality of write locations is initialized by interrupting the running of the optimized test case and initializing that write location immediately prior to executing a test case instruction in the set of test case instructions that writes to that write location.

13. A computer system comprising:

a processor(s) set; and a non-transitory software storage device;

wherein:

the processor set is structured, located, connected and/or programmed to run software stored on the software storage device;

the software comprises:

first program instructions programmed to create an optimized test case, comprising a set of test case instructions, for testing a system utilizing a data storage device including a plurality of storage locations, the optimized test case defining a plurality of write locations on the data storage device and a plurality of read locations on the data storage device;

second program instructions programmed to execute a set of initialization instructions that initialize the plurality of write locations without initializing the plurality of read locations; and third program instructions programmed to run the optimized test case so that the set of test case instructions first writes to each write location of the plurality of write locations after the set of initialization instructions initializes that write location;

the optimized test case defines the plurality of read locations as those locations on the data storage device to be read from but not written to by the set of test case instructions during execution of the optimized test case; and the optimized test case defines the plurality of write locations as: (i) those locations on the data storage device to be written to but not read from by the set of test case instructions during execution of the optimized test case, and (ii) those locations on the data storage device to be read from by the set of test case instructions during execution of the optimized test case only after being written to by the set of test case instructions during execution of the optimized test case.

14. The system of claim 13 wherein the running of the optimized test case is a second run of the optimized test case, the system further comprising:

fourth program instructions programmed to initially run the optimized test case;

wherein:

the initial run and the second run are performed at different timings; and the initial run is completed before execution of the set of initialization instructions.

15. The system of claim 13 wherein the running of the optimized test case is a second run of the optimized test case, the software further comprising fourth program instructions programmed to generate the set of initialization instructions by:

interrupting an initial run of the optimized test case at one or more write instructions of the set of test case instructions writing to one or more write locations in the plurality of write locations; and extracting information about the one or more write instructions sufficient to generate one or more initialization instructions to initialize the one or more write locations.

16. The system of claim 13 wherein:

the second program instructions are programmed to generate the set of initialization instructions without running the optimized test case.

17. The system of claim 13 wherein:

the second program instructions are programmed to completely execute the set of initialization instructions before the third program instructions begin running the optimized test case.

18. The system of claim 13 wherein:

the second program instructions are further programmed to execute the set of initialization instructions so that each write location in the plurality of write locations is initialized by interrupting the running of the optimized test case and initializing that write location immediately prior to executing a test case instruction in the set of test case instructions that writes to that write location.

\* \* \* \* \*